United States Patent
Kim et al.

(10) Patent No.: US 7,085,979 B2
(45) Date of Patent: Aug. 1, 2006

(54) VOLTAGE-GLITCH DETECTION DEVICE AND METHOD FOR SECURING INTEGRATED CIRCUIT DEVICE FROM VOLTAGE GLITCH ATTACK

(75) Inventors: Chan-Yong Kim, Kyunggi-do (KR); Sang-Joo Jun, Yongin-shi (KR); Eui-Seung Kim, Yongin-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 420 days.

(21) Appl. No.: 10/443,427

(22) Filed: May 22, 2003

(65) Prior Publication Data

US 2003/0226082 A1    Dec. 4, 2003

(30) Foreign Application Priority Data

May 31, 2002   (KR) .................... 10-2002-0030596

(51) Int. Cl.
*G01R 31/28*    (2006.01)
(52) U.S. Cl. ....................... 714/734; 714/733
(58) Field of Classification Search ................. 365/45; 327/74, 142, 108; 361/90; 714/734, 733
See application file for complete search history.

(56) References Cited

U.S. PATENT DOCUMENTS

| | | | |
|---|---|---|---|
| 4,285,051 A * | 8/1981 | Henneuse | 365/45 |
| 4,968,901 A * | 11/1990 | Shacter | 327/74 |
| 5,136,186 A * | 8/1992 | Trinh et al. | 327/142 |
| 5,666,078 A * | 9/1997 | Lamphier et al. | 327/108 |
| 6,025,981 A | 2/2000 | Wu | |
| 6,085,342 A | 7/2000 | Marholev et al. | |
| 6,751,079 B1 * | 6/2004 | Bretschneider | 361/90 |

FOREIGN PATENT DOCUMENTS

WO    WO 00/72252 A1    11/2000

* cited by examiner

*Primary Examiner*—David Ton
(74) *Attorney, Agent, or Firm*—F. Chau & Associates, LLC

(57) ABSTRACT

A voltage-glitch detection circuit includes a voltage comparator having two input terminals with different capacitance resistance charge/discharge time. Voltage dividers are coupled to the two input terminals of the voltage comparator respectively, and commonly receive a supply voltage. One of the voltage dividers is supplied to the voltage comparator as a reference voltage of the voltage comparator, and the other is supplied as a glitch detection voltage to the voltage comparator.

18 Claims, 9 Drawing Sheets

VOLTAGE-GLITCH DETECTION DEVICE AND METHOD FOR SECURING INTEGRATED CIRCUIT DEVICE FROM VOLTAGE GLITCH ATTACK

BACKGROUND OF THE INVENTION

1. Field of the Invention

The present invention relates to a voltage-glitch detection circuit and, more particularly, to a circuit for securing an integrated circuit smart card from a glitch attack.

2. Discussion of Related Art

A smart card contains electronics in the form of integrated circuit (IC) chips such as a central processing unit (CPU) or microprocessor, a chip operating system (COS), an electrically erasable and programmable read only memory (EEPROM) acting as a secure storage area, and so forth. The IC chips are usually mounted on a surface of a plastic card whose material and size are similar or the same as a typical credit card.

Depending on the electronics on the smart card, information can be stored, processed, read, erased as well as communicate with the outside. Because smart cards can be easily misplaced, and information stored thereon can be highly sensitive and confidential, smart cards are tightly controlled and protected by embedded security and password systems. Smart cards are used, for example, as ATM cards for banking transactions, as phone cards with prepaid time for phone calls or used in time-based cellular phones. Other uses of smart cards include, for example, the authentication of a user connected to an Internet Bank; the payment for parking; the payment of subway, train or bus fare; the direct supply of personal information to a hospital or a doctor; and Internet shopping.

As usage of smart cards for routine financial transactions increases, the incentive for unauthorized access or tampering of the smart cards also increases. Microprobing, software attacks, eavesdropping, and fault generation are known methods of tampering.

Microprobing involves directly accessing a chip surface. Software attack involves interfacing the processor and accessing password algorithm or algorithm execution in a protocol. Eavesdropping involves measuring and detecting smart card signaling characteristics and electromagnetic radiations from the smart card during a normal operation. Fault generation uses an abnormal circumstance condition to generate a processor error providing an additional access. The microprobing technique is an invasive attack, and the other techniques are non-invasive.

A glitch attack involves application of an externally applied signal or energy to the smart card or the power source to access the smart card. For example, data may be extracted from an EEPROM by applying a glitch to the voltage supply for driving an internal chip of the smart card. A glitch attack may also involve a communication between the smart card and a smart card terminal made through a series of sequential operations. First, when a card is inserted into a card terminal (in case of a touch smart card), the card and the card terminal are connected to each other. The card terminal provides power and a set of signals to the card. The card receives a constant chip operation voltage (Vdd) from the power supply voltage so that the chip can operate. If the card is reset by a reset signal, the card generates an Answer To Reset (ATR) to exchange information between the card and the card terminal. The ATR protocol is defined in ISO/IEC 7816 part 3, and has parameters such as a physical property and a logical characteristic of an exchange protocol.

When N data are read out from a specific address of a smart card chip to transmit an ATR, a high voltage glitch may occur. The high voltage glitch may cause an EEPROM dump, resulting in data being read from an ffh address of the EEPROM.

A need therefore exists for a voltage-glitch detection circuit for detecting a voltage glitch, and an integrated circuit device for securing internal information from a voltage glitch.

SUMMARY OF THE INVENTION

According to an embodiment of the present invention, a chip operation voltage for driving an integrated circuit chip is divided into voltages having a predetermined voltage difference by a voltage divider. The divided voltages are used as two input voltages of a voltage comparator. The voltage comparator generates an output voltage based on a voltage difference between the two input voltages. The voltage divider comprises a first voltage divider and a second voltage divider. Each of the first and second voltage dividers has at least two resistors serially coupled between the chip operation voltage source and a ground, and uses voltages of nodes (i.e., a first node and a second node) between the two resistors as input voltages. A high capacitance capacitor is coupled between one of the nodes and the ground to increase voltage rise and fall times at this node. Accordingly, if positive voltage glitch (high glitch) or a negative going glitch (low glitch) temporarily increasing or decreasing the chip operation voltage, respectively, a node voltage where the high capacitance capacitor is coupled is not change since the RC (resistor capacitor) charge/discharge time is long at the node having the high capacitance capacitor. However, a voltage of the other node without having a capacitor follows the glitch to increase or decrease the voltage at the node. Accordingly, if a glitch occurs, the output signal of the voltage comparator changes. The state change of the output signal makes it possible to detect the glitch.

The voltage of the node having the high capacitance capacitor is employed as a reference voltage of the voltage comparator, which is an input for a non-inverting input terminal, and the voltage of the node without having a capacitor is employed as a detection voltage, which is an input for an inverting input terminal. If the resistors coupled between the chip operation voltage and the ground are adjusted to make the reference voltage higher than the detection voltage, a high glitch can be detected. If the reference voltage is set at lower than the detection, a low glitch can be detected. Further, a high capacitance capacitor may be coupled to a node providing the detection voltage and ground, and a capacitor need not be coupled between the reference voltage and ground. In this case, if the reference voltage is higher than the detection voltage, the low glitch can be detected. If the reference voltage is lower than the detection voltage, the high glitch can be detected.

To stabilize the circuit, a low capacitance capacitor may be coupled between the node having no capacitor and ground. In this case, a capacitor charge/discharge time (i.e., a node voltage rise/drop time) becomes very short since capacitance is very low. Accordingly, if the glitch occurs, a voltage fluctuation band of the node having the high capacitance capacitor is very small while that of the node having the low capacitance capacitor is great. Thus, an output signal of the voltage comparator changes in state to detect the glitch.

A difference between two voltages applied to the voltage comparator is dependent upon the specification of a detection-desired glitch. By simply adjusting the resistance of the resistors, the voltage difference may readily be made. A capacitance of a capacitor or a difference between the capacitance of two capacitors may be determined considering a voltage difference of the voltage comparator, a glitch occurrence time and so forth. The capacitance or capacitance difference is determined so that the voltage difference at the respective nodes has different signs after and before occurrence of the glitch.

If an additional voltage comparator is provided to the detection circuit, both the low glitch and the high glitch can be detected. The detection circuit further includes a third voltage divider for applying two input voltages of the additional voltage comparator. The additional voltage comparator receives one voltage from the third voltage divider and receives another voltage from one of the first and second voltage dividers, generating an output signal by means of a difference between the two received voltages. As a result, one of the first and second voltage dividers supplies a voltage to two voltage comparators at the same time. For example, the second voltage divider supplies a reference voltage to two voltage comparators, the first voltage divider supplies a detection voltage to one voltage comparator, and the third voltage divider supplies a detection voltage to the other voltage comparator (i.e., an additional voltage comparator). In this case, a second voltage by the second voltage divider is higher than a first voltage by the first voltage divider and lower than a third voltage by the third voltage divider. A second node of the second voltage divider has the high capacitance capacitor. If a high glitch occurs in the case that the third voltage is higher than the first voltage, an output signal of the first voltage comparator changes in state. Therefore, a high glitch can be detected. If a low glitch occurs in the case that the third voltage is higher than the first voltage, an output signal of the second comparator changes in state. Therefore, the low glitch can be detected. As a result, both low glitch and high glitch can be detected.

According to another embodiment of the present invention, a method of securing an integrated circuit device from an external glitch attack is provided. The method includes generating a reference voltage and a detection voltage using an operation voltage of the integrated circuit device, comparing the reference voltage and the detection voltage to detect a glitch attack occurring at the operation voltage of the integrated circuit device, and forcibly resetting the integrated circuit device when the glitch attack is detected. The reference voltage is impervious to variations in voltages of the glitch, as compared to the detection voltage.

According to at least one embodiment of the glitch detection circuit, instead of special power sources for applying two voltages to a comparator, a chip operation voltage is divided by a voltage divider into two voltages for the comparator.

BRIEF DESCRIPTION OF THE DRAWINGS

FIG. 2A and FIG. 2D are signal waveforms when a high glitch occurs and FIG. 2B and FIG. 2C are waveform diagrams when a low glitch occurs.

DETAILED DESCRIPTION OF PREFERRED EMBODIMENTS

Figure 1:
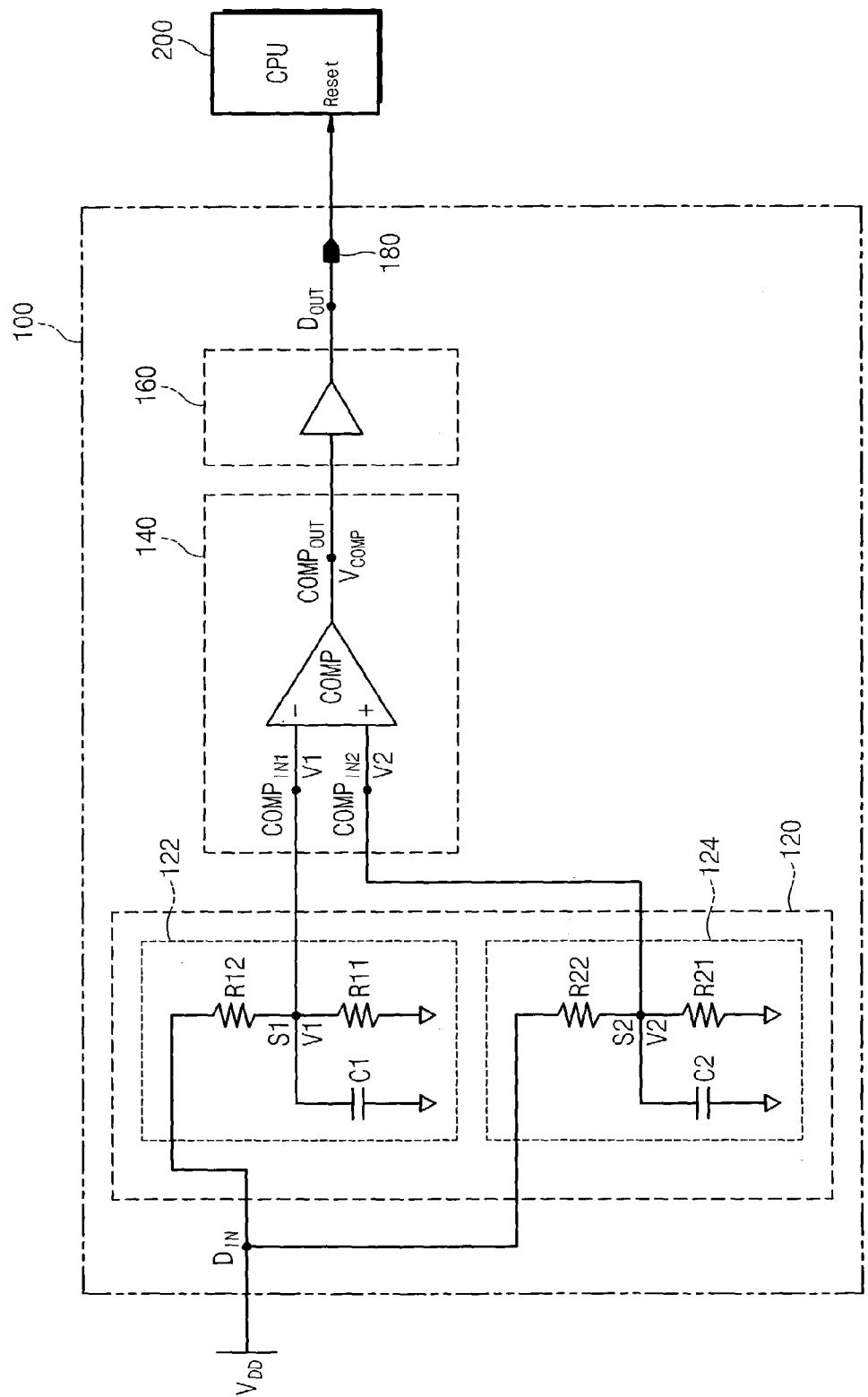
FIG. 1 is a circuit diagram of a glitch detection circuit according to an embodiment of the present invention.

The operation of a glitch detection circuit 100 according to an embodiment of the present invention is described with reference to FIG. 1. The glitch detection circuit 100 includes a detector input terminal $D_{IN}$, a voltage divider 120, a voltage comparator 140, and buffering means 160. The voltage divider divides a chip operation voltage $V_{DD}$ applied to the detector input terminal $D_{IN}$ into voltages V1 and V2 having a predetermined voltage difference. The voltage comparator 140 receives the divided voltages V1 and V2 through two input terminals $COMP_{IN1}$ and $COMP_{IN2}$, generating a comparison signal Vcomp to an output terminal $COMP_{OUT}$ by means of the voltage difference between the received voltages V1 and V2. The buffering means 160 buffers the comparison signal Vcomp of the output terminal $COMP_{OUT}$, generating a detection signal 180 to a detector output terminal $D_{OUT}$. When a glitch does not occur, the detector output terminal $D_{OUT}$ outputs the detection signal 180 with logic high. When a glitch occurs, the detector output terminal $D_{OUT}$ generates the detection signal 180 with logic low and resets a CPU 200 to reset the integrated circuit chip.

The voltage divider 120 includes a first voltage divider 122 for dividing the chip operation voltage $V_{DD}$ into the first voltage V1 and a second voltage divider 124 for dividing the chip operation voltage $V_{DD}$ into the second voltage V2. The first voltage divider 122 has two resistors R12 and R11 that are connected in series between the detector input terminal $D_{IN}$ and a ground GND. Thus, the first voltage V1 is formed at a node (first node) S1 between the two resistors R12 and R11 depending on the following equation 1.

$$V1 = V_{DD} \times \frac{R11}{(R11 + R12)} \qquad (1)$$

The second voltage divider 124 includes two resistors R22 and R21 that are connected in series between the detector input terminal $D_{IN}$ and the ground GND. Thus, the second voltage V2 is formed at a node (second node) S2 between the two resistors R22 and R21 depending on the following equation 2.

$$V2 = V_{DD} \times \frac{R21}{(R21 + R22)} \quad (2)$$

The first and second voltages V1 and V2 are based on magnitudes of the two resistors (R12 and R11) and (R22 and R21), respectively. A difference between the two voltages V2 and V1 (V2−V1) is based on an intensity of a detection-desired glitch. According to an embodiment of the present invention, the first and second voltages V1 and V2 may readily be set from the chip operation voltage $V_{DD}$ by suitably adjusting a ratio of the resistors R12, R11, R22, and R21.

The first voltage V1 obtained by the first voltage divider 122 is applied to the first input terminal $COMP_{IN1}$ (inverting input terminal (−)) of the voltage comparator 140, acting as a detection voltage of the voltage comparator 140. The second voltage V2 obtained by the second voltage driver 124 is applied to the second input terminal $COMP_{IN2}$ (non-inverting input terminal (+)) of the voltage comparator 140, acting as a reference voltage of the voltage comparator 140. Thus, the two voltages applied to the voltage comparator 140 are voltage divided from the chip operation voltage. When the detection voltage V1 is higher than the reference voltage V2, the voltage comparator 140 generates a logic low comparison signal at an output terminal $COMP_{OUT}$ of the voltage comparator 140. When the detection voltage V1 is lower than the reference voltage V2, the voltage comparator 140 generates a logic high comparison signal at the output terminal $COMP_{OUT}$ of the voltage comparator 140.

The first voltage divider 122 has a first capacitor C1 between the first node S1 and the ground, and the second voltage divider 124 has a second capacitor C2 between the second node S2 and the ground. Preferably, there is a large difference in capacitance between the first and second capacitors C1 and C2. One capacitor (e.g., C2) has a high capacitance, and the other capacitor (e.g., C1) has a very low capacitance.

When a high glitch occurs to temporarily increase the voltage of the detector input terminal $D_{IN}$, a second initial voltage V2 at the second node S2 is also temporarily increased but with delay. Due to the large capacitance of capacitor C2 being coupled between the second node S2 and ground, the high glitch disappears before the capacitor C2 is sufficiently charged. On the other hand, since the low capacitance capacitor C1 is coupled between the first node S1 and ground, a first initial voltage V1 temporarily increases without delay to be higher than the voltage at the second node S2, and then returns to its initial value. This is because a charge time of the capacitor C1 is shorter so that the capacitor C1 is sufficiently charged during the occurrence of the high glitch. Hence, a glitch voltage at the first node S1 applied to the first input terminal $COMP_{IN1}$ of the voltage comparator 140 becomes higher than a glitch voltage at the second node S2 applied to the second input terminal $COMP_{IN2}$ of the comparator 140. The comparator 140 outputs at the output terminal $COMP_{OUT}$ a transition from a high level to a low level. This $COMP_{OUT}$ signal is buffered by buffer 160 to generate a logic low glitch detection signal at the detector output terminal $D_{OUT}$, thereby resetting CPU 180.

According to this embodiment of the invention, the capacitance of the two capacitors C1 and C2 may suitably be selected according to the difference between two voltages applied to two input terminals of a voltage comparator. For example, the low capacitance capacitor C1 may not be needed. In this case, a voltage increase time at the first node S1 without capacitor C1 is zero because there is no capacitor in the first node S1.

If a time constant (R21×C2) at a node (e.g., S2) having the high capacitance capacitor C2 is set to be higher than a time constant (R11×C1) at a node (e.g., S1) having the low capacitance capacitor C1 (that is, R21×C2>R11×C1), a glitch may be detected more effectively. Thus, even though a capacitance difference is not great, a glitch may be detected by suitably adjusting resistance values of resistors coupled to respective nodes.

Figure 2A:
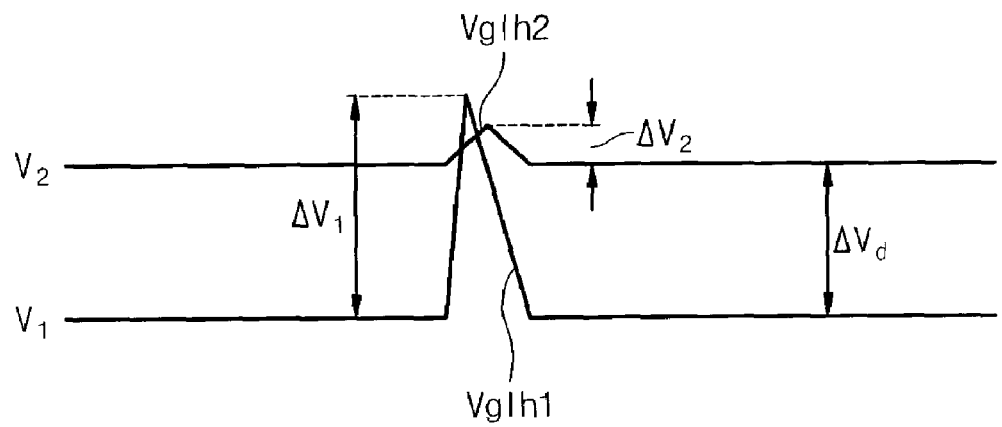
FIG. 2A through FIG. 2D show signal waveforms of voltage divider nodes shown in FIG. 1.
Figure 2B:
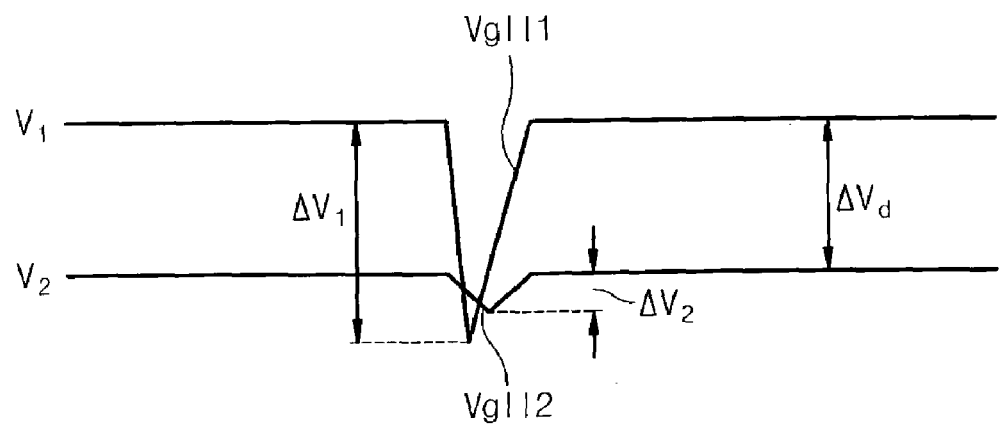

FIG. 2A and FIG. 2B show waveforms of a glitch voltage applied to two input terminals of a voltage comparator 140 when a high glitch and a low glitch occur at a chip operation voltage $V_{DD}$, respectively.

In the glitch detection circuit 100 of FIG. 1, there may be a case where a second voltage V2 is higher than a first voltage V1 (V2>V1) and a capacitance of a second capacitor C2 is higher than a capacitance of a first capacitor C1 (C2>C1). Accordingly, the ratio of $$\frac{R11}{(R11 + R12)}$$

is set to be lower than the ratio of $$\frac{R21}{(R21 + R22)}$$

to readily generate a second voltage V2 higher than a first voltage V1. In this case, the buffering means 160 has two successive inverters and the glitch detection circuit 100 can detect a high glitch.

More specifically, since the reference voltage V2 is higher than the detection voltage V1, the voltage comparator 140 generates a logic high (logic '1') comparison signal at the output terminal $COMP_{OUT}$ of the voltage comparator 140. The logic high comparison signal generated at the comparator output terminal $COMP_{OUT}$ passes the buffering means 160 having two inverters to form a logic high detection signal 180 at the detector output terminal $D_{OUT}$.

When a rapidly increasing glitch occurs on a chip operation voltage $V_{DD}$ (i.e., a high glitch; Vglh), glitch voltages Vglh1 and Vglh2, which are higher than the initial voltages (before glitch) respectively, appear at the first node S1 and the second node S2 depending on the following equations 3 and 4.

$$\text{first glitch voltage } Vglh1 \text{ of first node } S1 = V1 + Vglh \times \frac{R11}{(R11 + R12)} \quad (3)$$

$$\text{second glitch voltage } Vglh2 \text{ of second node } S2 = \quad (4)$$

$$V2 + Vglh \times \frac{R21}{(R21 + R22)}$$

However, because a high capacitance capacitor C2 is coupled between the second node S2 of the second voltage divider 124 and the ground, a value of $$\left\{ V_{glh} \times \frac{R21}{(R21+R22)} \right\}$$

in the equation 4 is increased slowly with very little change ($\Delta V2$ is very small) and delay. As a result, the glitch voltage Vglh2 at the second node S2 does not follow a glitch which lasts for a very short time. Therefore, the glitch voltage Vglh2 is substantially identical with the initial second voltage V2 before the glitch because it takes a long time to charge a high capacitance capacitor C2. Thus, the second glitch voltage Vglh 2 that is substantially identical with the second initial voltage V2 appears at the second node to be provided to the second input terminal $COMP_{IN2}$ of the voltage comparator 140, as shown in FIG. 2A. Since the first voltage divider 122 has the low capacitance capacitor C1, a value of $$\left\{ V_{glh} \times \frac{R11}{(R11+R12)} \right\}$$

in the equation 3 is more quickly increased to a greater value ($\Delta V1$) without delay from the first initial voltage V1. The first glitch voltage Vglh 1 at the first node becomes higher than the glitch voltage Vglh 2 of the second node, and then returns to the first initial voltage V1. Thus, since the capacitor C1 has a low capacitance, the voltage at the first node substantially follows the first glitch voltage Vglh 1 during occurrence of a glitch attack. The first glitch voltage Vglh1, which is higher than the second glitch voltage Vglh 2 of the second node, is applied to the first input terminal $COMP_{IN1}$ of the voltage comparator 140. As a result, a logic low signal is generated at the output terminal $COMP_{OUT}$ of the voltage comparator 140. The generated logic low signal passes the buffering means 160 to form a logic low detection signal 180 at the detector output terminal $D_{OUT}$. Thus, a central processing unit (CPU) is set by the detection signal 180 to detect a high glitch.

In the case where the first voltage V1 is higher than the second voltage V2 (V1>V2) and the capacitance of the second capacitor C2 is higher than the capacitance of the first capacitor C1 (C2>C1), the ratio of $$\frac{R11}{(R11+R12)}$$

is set to be larger than the ratio of $$\frac{R21}{(R21+R22)}$$

to obtain desired voltages V1 and V2. In this case, the buffering means 160 has one inverter and the glitch detection circuit 100 can detect a low glitch which rapidly reduces an operation voltage for a very short time.

Since the first voltage V1 is higher than the second voltage V2 in the absence of glitch attack, the voltage comparator 140 generates a logic low (logic '0') comparison signal at the output terminal $COMP_{OUT}$ of the voltage comparator 140. The logic low comparison signal generated at the output terminal $COMP_{OUT}$ passes the buffering means 160 to generate a logic high detection signal at the detector output terminal $D_{OUT}$.

However, when a low glitch occurs at an operation voltage, a second glitch voltage Vgll2 appears at the second node S2 to be applied to a second input terminal of the voltage comparator 140. Here the second voltage Vgll2 is lower than the second voltage V2 by $\Delta V2$. However, a first glitch voltage Vgll1 appears at the first node that is significantly reduced from the initial first voltage V1 and is lower than the second glitch voltage Vgl2. Thus a first glitch voltage Vgll1 at the first node Si1, which is lower than the second glitch voltage Vgll2, is applied to the first input terminal of the voltage comparator 140. Accordingly, a logic high comparison signal is generated at the output terminal $COMP_{OUT}$ of the voltage comparator 140. The logic high comparison signal passes the buffering means 160, so that a logic low detection signal 180 is generated at the detector output terminal $D_{OUT}$ to reset the CPU.

Figure 2C:
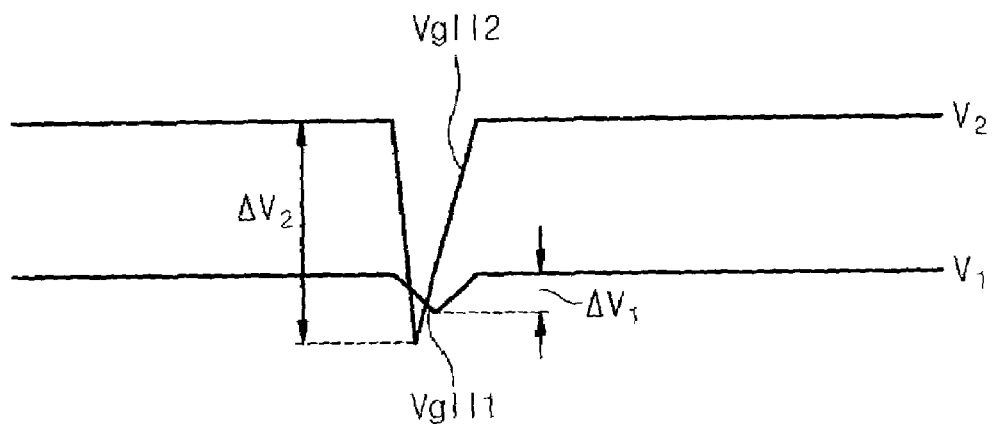
Figure 2D:
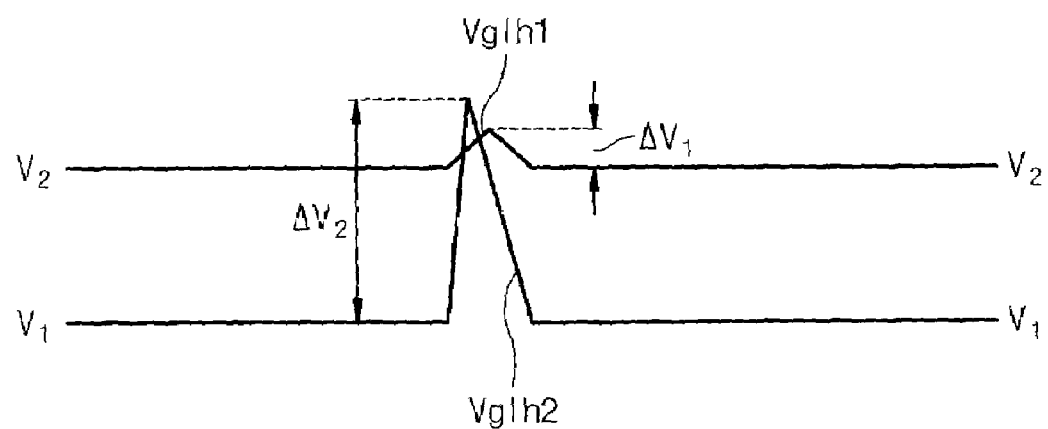

One skilled in the art can readily appreciate that the foregoing embodiment may be modified. For example, if the first voltage V1 is set to be lower than the second voltage V2 (V1<V2) and the capacitance of the first capacitor C1 is set to be higher than the capacitance of the second capacitor C2 (C1>C2), the voltage detection circuit 100 can detect a low glitch (see FIG. 2C). If the first voltage V1 is set to be higher than the second voltage V2 (V1>V2), the voltage detection circuit 100 can detect a high glitch (see FIG. 2D).

In the event that an integrated circuit chip is tested, what is needed is to pause the operation of a glitch detection circuit for a while. For this purpose, using a special voltage source, an output of a voltage comparator may be maintained as a constant signal.

Figure 3:
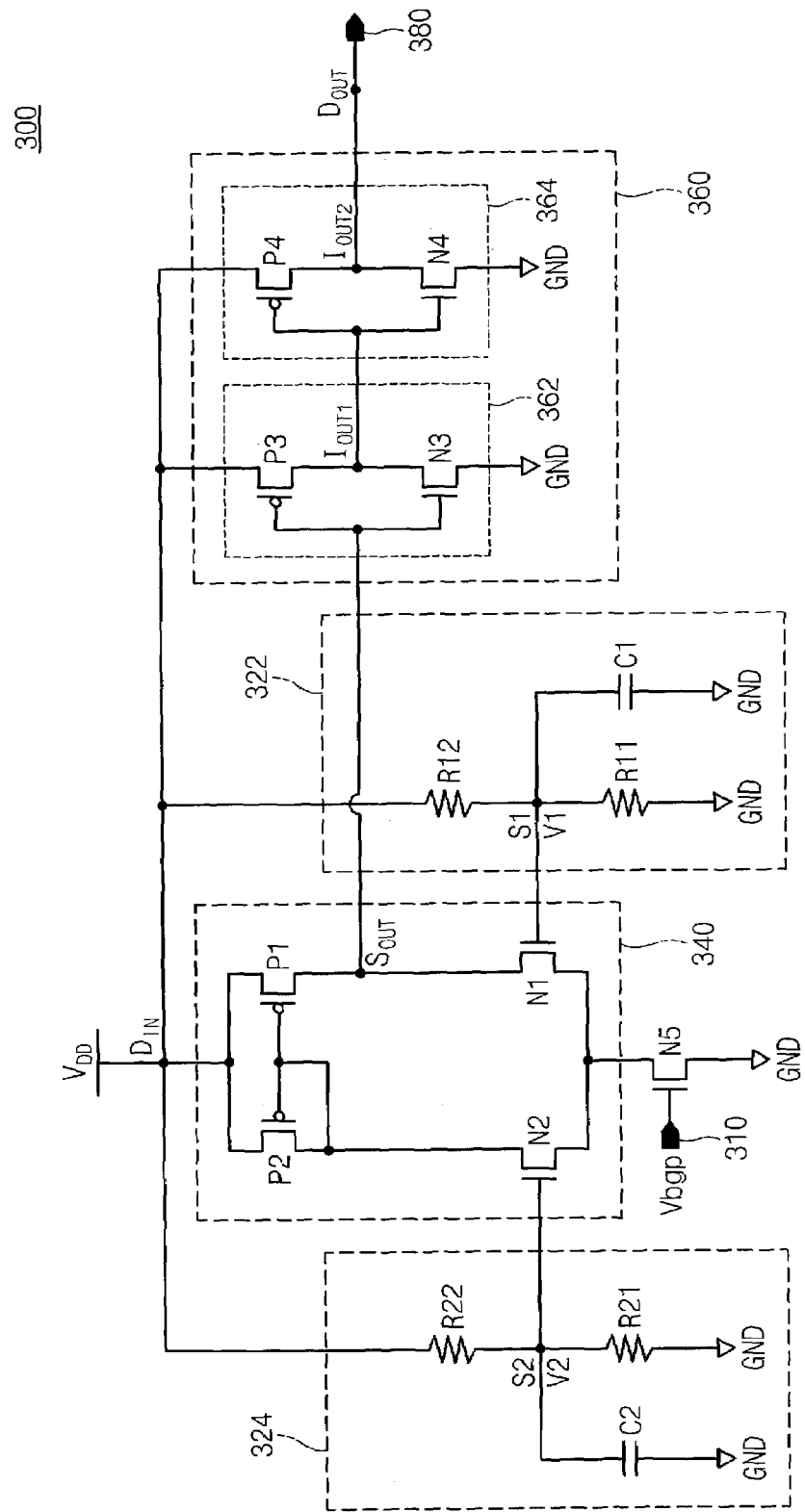
FIG. 3 is a circuit diagram of a high glitch detection circuit according to an embodiment of the present invention.
Figure 4:
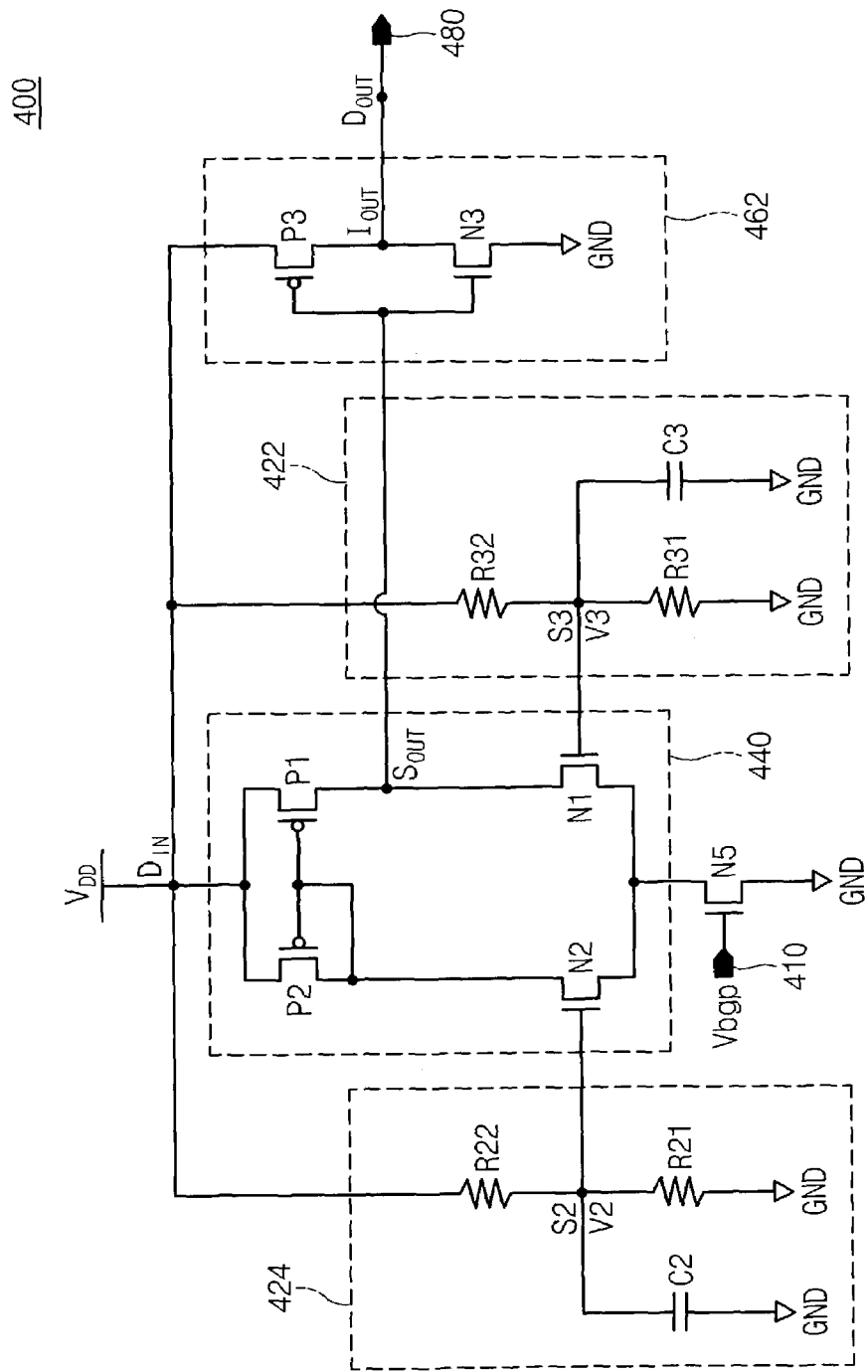
FIG. 4 is a circuit diagram of a low glitch detection circuit according to an embodiment of the present invention.

FIG. 3 and FIG. 4 show a glitch detection circuit 100 of FIG. 1 in further detail. FIG. 3 illustrates a high glitch detection circuit 300 and FIG. 4 illustrates a low glitch detection circuit 400.

In FIG. 3, a voltage comparator includes a differential amplifier 340 and a bias-supply NMOS transistor N5 for receiving a bias voltage (Vbgp) 310 of a predetermined intensity from a bias circuit (not shown) to supply a received bias voltage 310 to the differential amplifier 340. The differential amplifier 340 has two PMOS transistors P1 and P2 and two NMOS transistors N1 and N2. A source electrode of the PMOS transistor P2 is connected to a detector input terminal ($D_{IN}$) to receive a chip operation voltage $V_{DD}$. A gate electrode and a drain electrode of the PMOS transistor P2 are coupled to each other. The PMOS transistor P1 has a source electrode connected to the chip operation voltage $V_{DD}$, a gate electrode coupled to the gate electrode of the PMOS transistor P2, and a drain electrode coupled to an output node $S_{OUT}$ for outputting a comparison signal. The NMOS transistor N2 has a drain electrode coupled to the drain electrode of the PMOS transistor P2, a gate electrode coupled to a second node S2 of a second voltage divider 324 to receive a second voltage V2, and a source electrode coupled to a drain electrode of a bias-supply NMOS transistor N5. The NMOS transistor N1 has a drain electrode coupled to the drain electrode of the PMOS transistor P1 and the output node $S_{OUT}$, a gate electrode coupled to a first node S1 of a first voltage divider 322 to receive a first voltage V1, and a source electrode coupled to the drain electrode of the bias-supply NMOS transistor N5. The bias-supply NMOS transistor N5 has the drain electrode coupled to the source electrodes of the NMOS transistors N1 and N2, a gate electrode for receiving a predetermined bias voltage from a bias circuit, and a source electrode coupled to a ground voltage GND.

The first voltage divider 322 has resistors R12 and R11 and a capacitor C1. The resistors R12 and R11 are connected in series between a detector input terminal $D_{IN}$ for receiving the chip operation voltage $V_{DD}$ and a ground voltage GND. The capacitor C1 is coupled between the first node S1 interconnecting the resistors R12 and R11 and the ground GND.

The second voltage divider 324 has two resistors R22 and R21 and a capacitor C2. The resistors R22 and R21 are connected in series between the detector input terminal $D_{IN}$ and a ground voltage GND. The capacitor is coupled between the second node S2 interconnecting the resistors R22 and R21 and the ground voltage GND.

The voltage V1 of the first node S1 in the first voltage divider 322 is determined depending on the above equation 1, while the voltage V2 of the second node S2 in the second voltage divider 324 is determined depending on the above equation 2. Values of resistors in the voltage dividers 322 and 324 are adjusted to make the second voltage V2 higher than the first voltage V1. A difference between the voltages V2 and V1 (V2−V1) can be variable depending on the intensity of a detection-desired high glitch. As previously mentioned, the first capacitor C1 of the first voltage divider 322 and the second capacitor C2 of the second voltage divider 324 have different capacitance values. The first capacitor C1 has a low capacitance, and the second capacitor C2 has a high capacitance.

The buffering means 360 includes two CMOS inverters 362 and 364. The first CMOS inverter 362 has a PMOS transistor P3 and an NMOS transistor N3 that are connected in series between a detector input terminal $D_{IN}$ and a ground GND. A source electrode of the PMOS transistor P3 is coupled to a detector input terminal $D_{IN}$ to receive the chip operation voltage. A source electrode of the NMOS transistor N3 is coupled to a ground electrode. Gate electrodes of the PMOS transistor P3 and the NMOS transistor N3 are coupled to each other and are coupled to an output node $S_{OUT}$ of the differential amplifier 340. Drain electrodes of the PMOS transistor P3 and the NMOS transistor N3 are coupled to each other to constitute a first inverter output node $I_{OUT1}$. The second inverter 364 has a PMOS transistor P4 and an NMOS transistor N4 that are connected in series between the detector input terminal $D_{IN}$ and the ground. A source electrode of the PMOS transistor P4 is coupled to the detector input terminal $D_{IN}$ to receive the chip operation voltage. A source electrode of the NMOS transistor N4 is coupled to the ground electrode. Gate electrodes of the PMOS transistor P4 and the NMOS transistor N4 are coupled to each other and coupled to the first inverter output node $I_{OUT1}$. Drain electrodes of the PMOS transistor P4 and the NMOS transistor N4 are coupled to each other to constitute a second inverter output node $I_{OUT2}$. The detector output terminal $D_{OUT}$ is coupled to the second inverter output node $I_{OUT2}$.

Now, described is the operation of the high glitch detection circuit 300 when a high glitch does not occur. The differential amplifier 340 compares the second voltage V2 applied to the gate electrode of the NMOS transistor N2 with the first voltage V1 applied to the gate electrode of the NMOS transistor N1, generating a comparison signal at the output terminal $S_{OUT}$ of the differential amplifier 340. Here the comparison signal corresponds to a difference between the voltages V2 and V1 (V2−V1). Since the second voltage V2 is higher than the first voltage V1, a logic high signal is generated at the output terminal $S_{OUT}$ as a comparison signal. Thus, the NMOS transistor N3 of the first inverter 362 is turned on to generate a logic low (0V) signal. When the logic low signal that is an output signal of the first inverter 362 is applied to the second inverter 364, the PMOS transistor P4 is turned on to generate a logic high signal having an operation voltage $V_{DD}$ at the output terminal $I_{OUT2}$. As a result, a logic high detection signal 180 is generated at the detector output terminal $D_{OUT}$, so that the CPU is not reset and a normal chip operation is carried out.

In a case when a high glitch occurs at the chip operation voltage for a short time (see FIG. 2A), the differential amplifier 340 compares the second voltage Vglh 2 applied to the gate electrode of the NMOS transistor N2 with the first voltage Vglh 1 applied to the gate electrode of the NMOS transistor N1, generating a comparison signal at the output terminal $S_{OUT}$ of the differential amplifier 340. Here the comparison signal corresponds to a difference between the voltages Vglh 2 and Vglh 1 (Vglh−Vglh2). When a high glitch occurs, the glitch voltage Vglh 2 of the second node S2 becomes lower than the glitch voltage Vglh 1 of the first node S1. Therefore, the differential amplifier 340 generates a logic low signal at the output terminal $S_{OUT}$ as a comparison signal. By the logic low comparison signal, the PMOS transistor P3 of the first inverter 362 is turned on to generate a logic high (operation voltage $V_{DD}$) signal at the output terminal $I_{OUT1}$ of the differential amplifier 340. When a logic high signal is applied to the second inverter 364, the NMOS transistor N4 is turned on to generate a logic low (ground voltage 0V) detection signal 380 at the output terminal $I_{OUT2}$. Accordingly, the CPU is reset.

Referring to FIG. 4, a low glitch detection circuit 400 includes a differential amplifier 440, a third voltage divider 422, and a second voltage divider 424. The low glitch detection circuit 400 is different from the high glitch detection circuit 300 in that magnitudes of resistors R31, R32, R21, and R22 are adjusted to make a second voltage V2 of a second node S2 in the second voltage divider 424 lower than a third voltage V3 of a third node S3 in the third voltage divider 422. Typically, the magnitude of the respective resistors is selected so that the second voltage $$\left(V_{DD} \times \frac{R21}{R21+R22}\right)$$

becomes lower than the third voltage $$\left(V_{DD} \times \frac{R31}{R31+R32}\right).$$

Further the low glitch detection circuit 400 includes second buffering means 462 having one inverter.

Now is described the operation of a low glitch detection circuit when a low glitch does not occur. The differential amplifier 440 compares a second voltage V2 applied to a gate electrode of an NMOS transistor N2 with a third voltage V3 applied to a gate electrode of an NMOS transistor N1, generating a comparison signal at an output terminal $S_{OUT}$ of the differential amplifier 440. Here the comparison signal corresponds to a difference between the voltages V2 and V3 (V2−V3). Since the second voltage V2 is lower than the third voltage V3, a logic low signal is generated at the output terminal $S_{OUT}$ as a comparison signal. Thus, a logic high detection signal 480 is generated at a detector output terminal $D_{OUT}$, so that a central processing unit (CPU) is not reset and a normal chip operation is carried out.

When a low glitch attaches and reduces the chip operation voltage for a short time, the differential amplifier 440 compares a glitch voltage Vgll2 applied to the gate electrode of the NMOS transistor N2 with a glitch voltage Vgll3 applied to the gate electrode of the NMOS transistor N1, generating a comparison signal at the output terminal $S_{OUT}$ of the differential amplifier 440. Here the comparison signal corresponds to a difference between the voltages Vgll2 and Vgll3 (Vgll2–Vgll3). When a low glitch occurs, a logic high comparison signal is generated at the output terminal $S_{OUT}$ because the glitch voltage Vgll2 generated at a second node S2 is higher than the glitch voltage Vgll3 generated at a third node S3. For the same reason, and the NMOS transistor N3 of the first inverter 462 is turned on to generate a logic low (ground voltage 0V) signal at the output terminal $I_{OUT}$. Thus, the logic low detection signal 480 is generated at the detector output terminal $D_{OUT}$ to reset the CPU.

Another embodiment of the present invention will now be described hereinafter more fully with reference to FIG. 5. A voltage-glitch detection circuit 500 of FIG. 5 can detect a low glitch and a high glitch at the same time. The voltage-glitch detection circuit 500 uses two voltage comparators, and detects a glitch according to a signal generated as an AND operation result after buffering outputs of two voltage comparators.

Specifically, the glitch detection circuit 500 includes two voltage comparators (a first voltage comparator 542 and a second voltage comparator 544), three voltage dividers (a first voltage divider 522, a second voltage divider 524, and a third voltage divider 526), first buffering means 562, second buffering means 564, and AND operation means 570. The first and second buffering means 562 and 564 buffer comparison signals generated from output terminals $COMP_{OUT1}$ and $COMP_{OUT2}$ of the first and second voltage comparators 542 and 544, respectively. The AND operation means 570 is an AND gate that receives signals generated from output terminals $B_{OUT1}$ and $B_{OUT2}$ of the first and second buffering means 562 and 564 and performs an AND operation of these received signals to be outputted. The first voltage divider 522 divides a chip operation voltage $V_{DD}$ into a first voltage V1 using two resistors R12 and R11 coupled in series between a detector input terminal $D_{IN}$ and a ground, and supplies the divided voltage V1 to an inverting input terminal that is a first input terminal $COMP_{IN1}$ (a first detection voltage) of a first voltage comparator 542. The first voltage divider 522 includes a capacitor C1 between a node S1 and the ground. The second voltage divider 524 divides the chip operation voltage $V_{DD}$ into a second voltage V2 using two resistors R22 and R21 coupled in series between the detector input terminal $D_{IN}$ and the ground, and supplies the divided voltage V2 to a second input terminal $COMP_{IN2}$ (a non-inverting input terminal) of the first voltage comparator 542 and the second voltage comparator 544 as a reference voltage. The second voltage divider 524 includes a capacitor C2 between a node S2 and the ground. The third voltage divider 526 divides the chip operation voltage $V_{DD}$ into a third voltage V3 using two resistors coupled in series between the detector input terminal $D_{IN}$ and a ground, and supplies the divided voltage V3 to an inverting input terminal that is a first input terminal $COMP_{IN1}$ (a second detection voltage) of the second voltage comparator 544. The third voltage divider 526 includes a capacitor C3 between a node S3 and the ground.

In this embodiment, the second voltage V2 concurrently supplied to the first and second voltage comparators 542 and 544 has a value between the first and third voltages V1 and V3. The capacitance of the second capacitor C2 is higher than the capacitance of the first and third capacitors C1 and C3. The capacitance of the first and third capacitors C1 and C3 are almost identical with each other, and have a very small value. Accordingly, when a high glitch or a low glitch occurs, a glitch voltage Vglh 2 or Vgll2 of the node S2 supplying a voltage to a second input terminal of each voltage comparator is virtually unchanged as compared to the second initial voltage V2 because the capacitance of the second capacitor C2 is high. However, since the capacitance of the first and third capacitors C1 and C3 is very low, glitch voltages (Vglh1 and Vglh3) or (Vgll1 and Vgll3) of the nodes S1 and S3 are considerably increased or decreased as compared to the voltages V1 and V3.

Specifically, in a case where the third voltage V3 is higher than the first voltage V1 (i.e., V3>V2>V1), the first buffering means 562 is comprised of two inverters and the second buffering means 564 is comprised of one inverter. The first voltage comparator 542 detects a high glitch, and the second voltage comparator 544 detects a low glitch. As a result, a state of a signal at an output terminal of the comparator 542 is varied when the high glitch occurs, and a state of a signal at an output terminal of the comparator 544 is varied when the low glitch occurs.

Now, described is the operation of the glitch detection circuit 500 when a circuit normally operates. Since the second voltage V2 is higher than the first voltage V1, a logic high comparison signal is generated at the output terminal $COMP_{OUT1}$ of the first voltage comparator 542. The logic high comparison signal is inputted to the AND operation means 570 through the first buffering means 562. Since the third voltage V3 is higher than the second voltage V2, a logic low comparison signal is generated at the output terminal $COMP_{OUT2}$ of the second voltage comparator 544. The logic low comparison signal is inputted to the AND operation means 570 through the second buffering means 364. As a result, a logic high detection signal 580 is generated at a detector output terminal $D_{OUT}$.

Figure 6A:
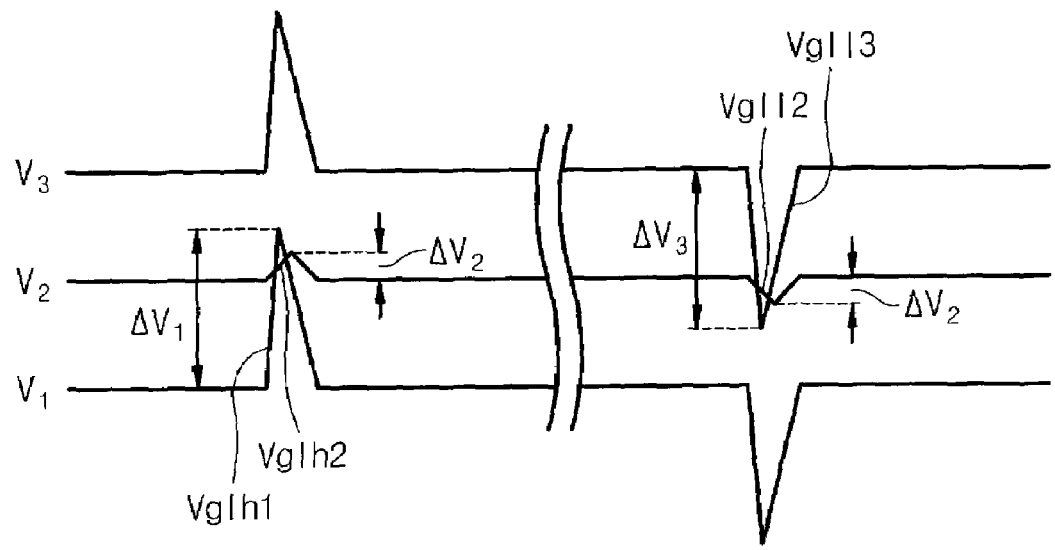
FIG. 6A and FIG. 6B are waveforms of nodes where voltages are inputted when a high glitch and a low glitch occur at the glitch detection circuit of FIG. 5, respectively.

When a high glitch occurs, the glitch voltage Vglh 1 of the first node S1 is higher than the glitch voltage Vglh 2 of the second node S2, as shown in a left portion of FIG. 6A. Thus, a logic high initial (before a glitch occurs) comparison signal is turned into a logic low comparison signal at an output terminal of the first voltage comparator 542, and a comparison signal at an output terminal of the second voltage comparator 544 is kept high. As a result, a logic low detection signal is generated at the detector output terminal $COMP_{OUT}$ to reset a central processing unit (CPU).

On the other hand, when a low glitch occurs, a logic high initial comparison signal is turned into a logic low comparison signal at an output terminal of the second voltage comparator 544, and a comparison signal at an output terminal of the first voltage comparator 542 is kept high. As a result, a logic low detection signal is generated at the detector output terminal $COMP_{OUT}$ to reset the CPU.

Figure 6B:
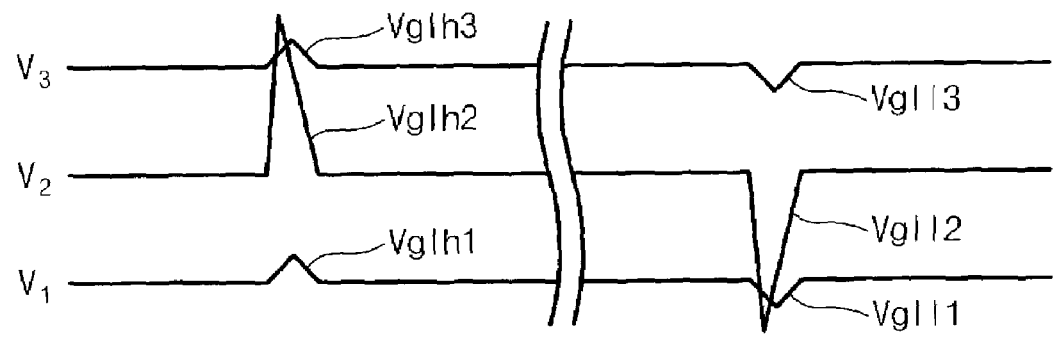

In the glitch detection circuit 500, the capacitance of the second capacitor C2 may be lower than the capacitance of the first and third capacitors C1 and C3. In this case, FIG. 6B shows node voltage waveforms when a high glitch and a low glitch occur. Since a capacitance of a second capacitor C2 is low, a voltage V2 of a second node S2 is considerably varied when a glitch occurs. Meanwhile, since the capacitance of the first and third capacitors C1 and C3 are low, voltages of the first and third nodes are virtually unchanged. Thus, an output of a second voltage comparator 544 is changed when the high glitch occurs while the output of a the first voltage comparator 542 is changed when the low glitch occurs. As a result, both the low glitch and the high glitch can be detected.

Figure 7:
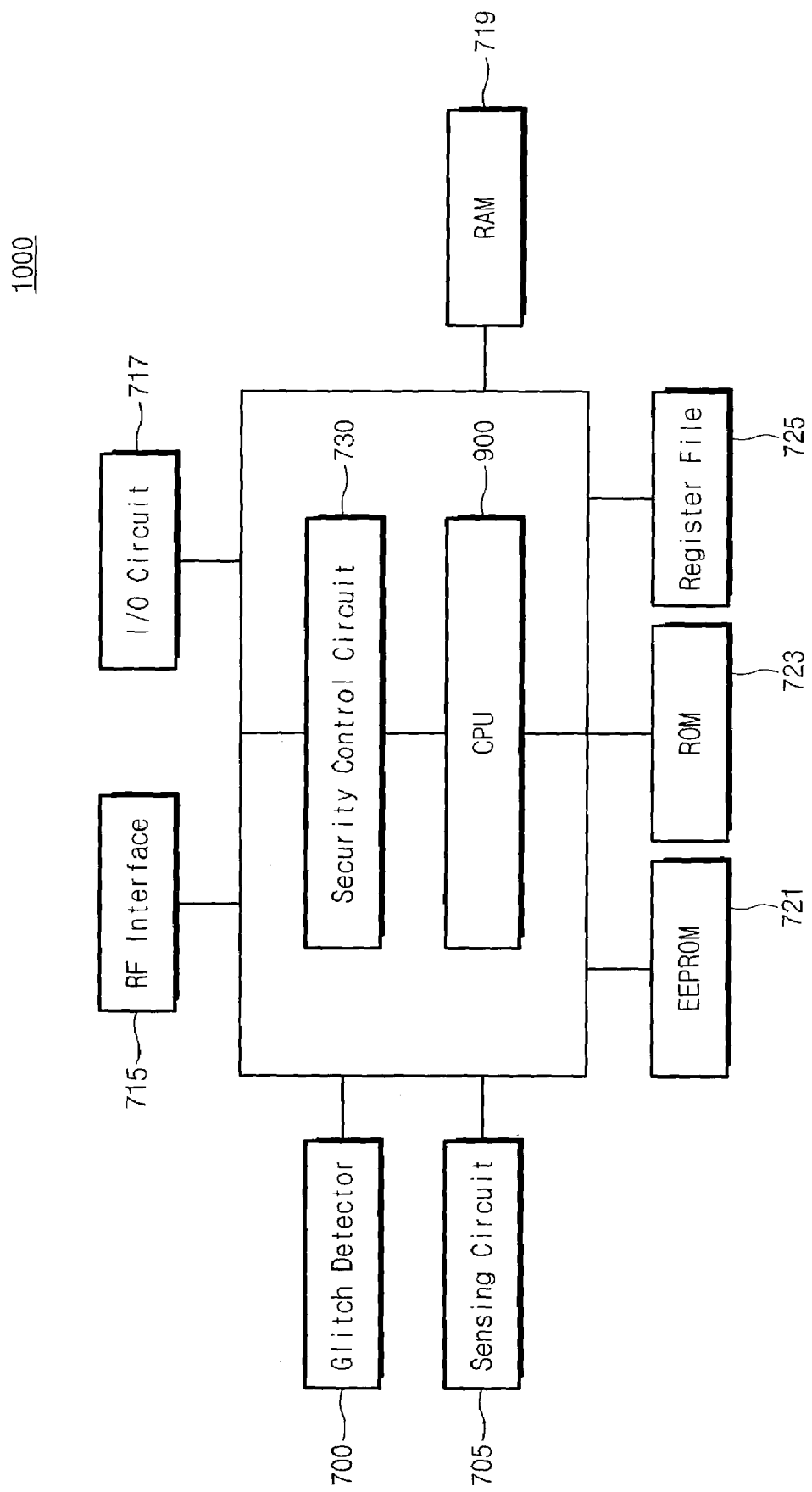
FIG. 7 is a block diagram of a smart card having a glitch detection circuit according to an embodiment of the present invention.

A smart card 1000 embedding an integrated circuit chip with a glitch detection circuit is schematically illustrated in FIG. 7. The smart card 1000 includes a glitch detector 700, a sensing circuit 705 having a temperature sensor, a light exposure sensor, a frequency sensor, and a passivation removal sensor, an input/output (I/O) circuit 717, a central processing unit (CPU) 900, a security control circuit 730, various memories such as an EEPROM 721, an ROM 723, and an RAM 719, a register file 725, and an RF interface 715. A card operating system (COS) for operating the integrated circuit chip and basic instructions are programmed into the ROM 723. The EEPROM 721 stores a data set, including user data (e.g., card issuer data) that is protected from external access by the CPU 900 and the COS and functions that are realizable in various applications. The RAM 719 is used to manage temporary data and correct an intermediate calculation result.

When one or both of the glitch detector 700 and the sensing circuit 705 output a low logic detection signal, the CPU 900 is reset.

If a high glitch occurs to temporarily alter an operation voltage driving an integrated circuit chip in a normal communication between the smart card 1000 and a card terminal (not shown), a low logic detection signal is generated by the glitch detector 700 to reset the CPU 700.

Figure 8:
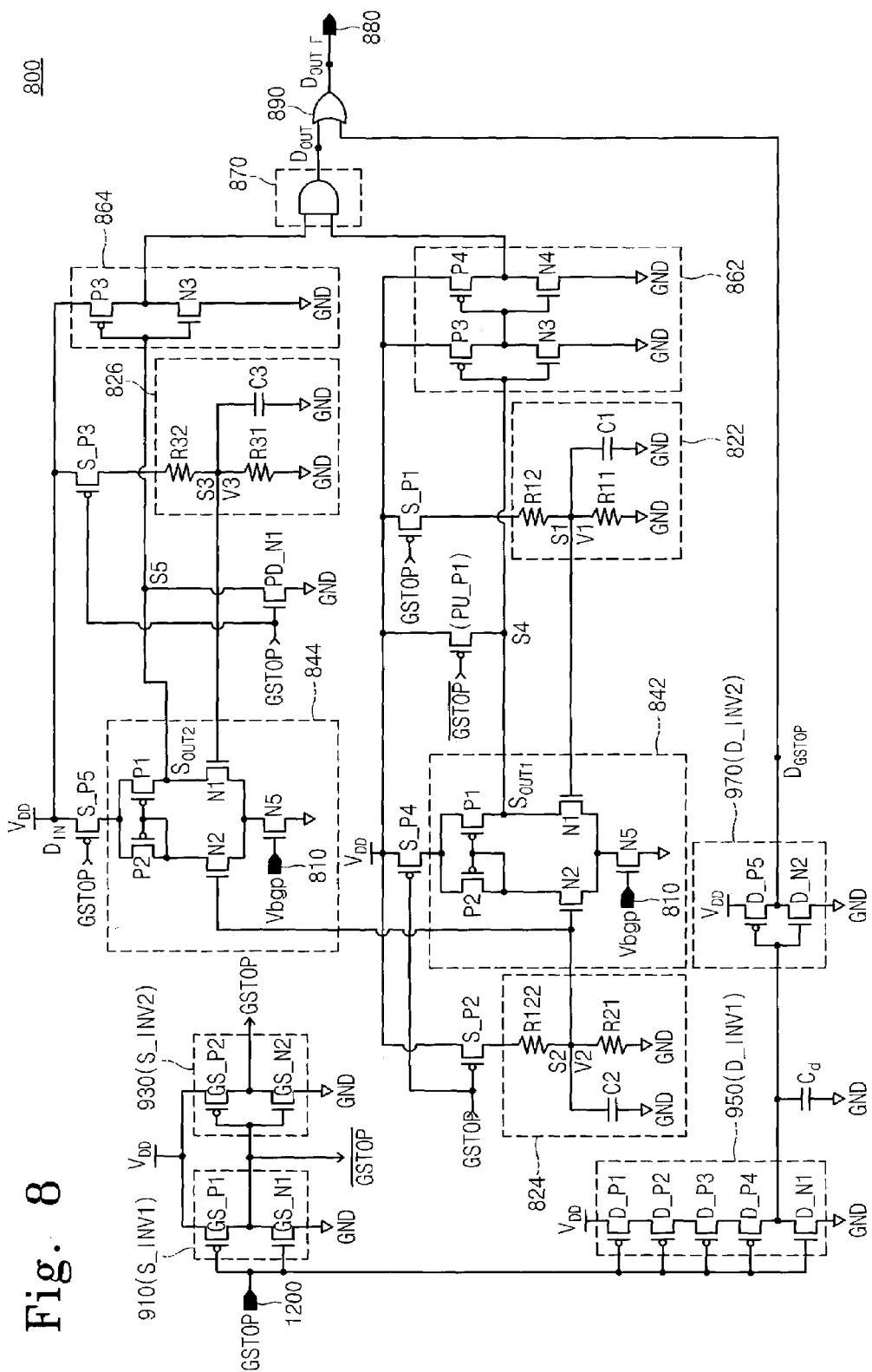
FIG. 8 is a circuit diagram of the glitch detection circuit of FIG. 7.

A preferred circuit diagram of the glitch detection circuit (FIG. 5) applied to the smart card (FIG. 7) is illustrated in FIG. 8. As previously described, a first voltage comparator 842 for detecting a high glitch and a second voltage comparator 844 for detecting a low glitch include a differential amplifier and an NMOS transistor N5, respectively. The differential amplifier has two PMOS transistors P1 and P2 and two NMOS transistors N1 and N2. The NMOS transistor receives a predetermined bias voltage (Vbgp) 810 from a bias circuit (not shown) and supplies the received bias voltage 810 to the differential amplifier through a gate electrode of the NMOS transistor N5.

First buffering means 862 having two inverters is coupled to an output terminal $S_{OUT1}$ of the first voltage comparator 842. Second buffering means 864 having one inverter is coupled to an output terminal $S_{OUT2}$ of the second voltage comparator 844. An output signal of each buffering means is inputted to an AND gate 870 acting as AND operation means. By the AND operation, a detection signal is outputted to a detector output terminal $D_{OUT}$.

A first voltage divider 822 divides an operation voltage to supply a first voltage V1 to the first voltage comparator 842. A third voltage divider 826 divides an operation voltage to supply a third voltage V3 to the second voltage comparator 844. A second voltage divider 824 commonly supplies a second voltage V2 to the first and second voltage comparators 842 and 844. As previously described, each of the voltage dividers 822, 824, and 826 includes resistors coupled between a detector input terminal and a ground and a capacitor disposed between a node and the ground.

Figure 5:
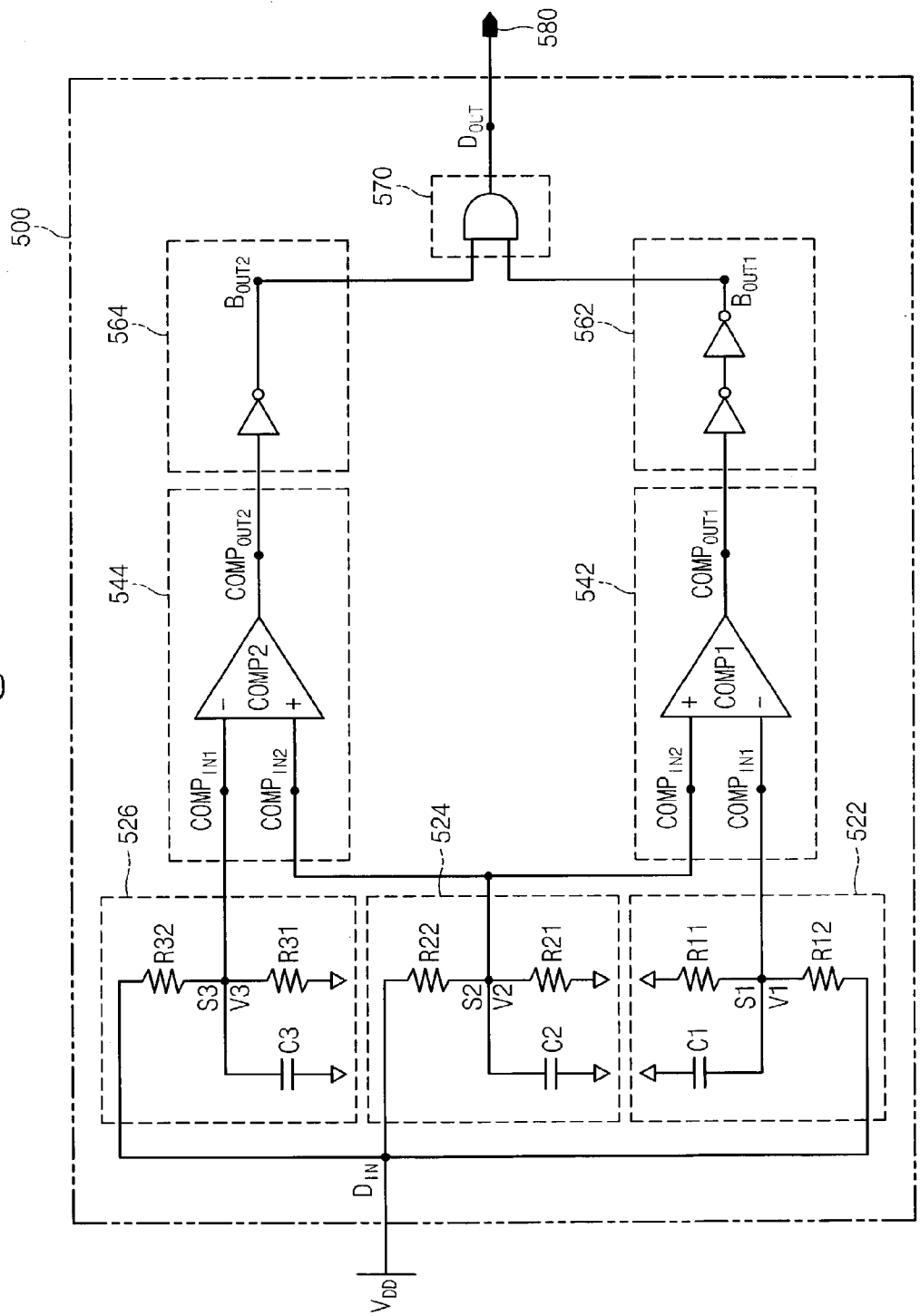
FIG. 5 is a circuit diagram of a glitch detection circuit according to another embodiment of the present invention for detecting both a high glitch and a low glitch.

As compared to the glitch detection circuit 500 shown in FIG. 5, the glitch detection circuit 800 shown in FIG. 8 further includes glitch detection stop means and an OR gate 890 acting as AND operation means. The AND operation means 890 adopts a detection signal of a detector output terminal $D_{OUT}$ as one input terminal and a glitch stop signal GSTOP of an output terminal $D_{GSTOP}$ of the glitch detection stop means as the other input terminal. This is to stop the operation of a glitch detection circuit for a while in the event that the performance of an integrated circuit chip is tested.

When it is necessary to stop detecting a glitch, the glitch detection stop means always makes low a comparison signal of an output terminal $S_{OUT1}$ of the first voltage comparator 842 for detecting a high glitch and makes high a comparison signal of an output terminal SOUT2 of the second voltage comparator for detecting a low glitch. Thus, irrespective of the occurrence of a glitch, the detection signal of the detector output terminal $D_{OUT}$ becomes low and the detection stop signal GSTOP of the detection stop output terminal $D_{GSTOP}$ becomes high. As a result, an output terminal $D_{OUT\_F}$ of an OR gate always stay at high.

Specifically, the glitch detection stop means includes a signal supply first inverter (S_INV1) 910, a signal supply second inverter (S_INV2) 930, a delay first inverter (D_INV1) 950, and a delay second inverter (D_INV2) 970. The signal supply inverters S_INV1 and S_INV2 are coupled in series to a cutoff signal source (not shown) to receive a detection stop signal (GSTOP) 1200. The delay inverters D_INV1 and D_INV2 are coupled in series to receive the detection stop signal GSTOP. An output of the delay second inverter D_INV2 is coupled to the detection stop output terminal $D_{GSTOP}$ to be outputted to the OR gate 890.

The glitch detection stop means further includes three cutoff PMOS transistors S_P1, S_P2, and S_P3, two cutoff PMOS transistors S_P4 and S_P5, a pull-up PMOS transistor PU_P1, a pull-down NMOS transistor PD_N1. The three cutoff PMOS transistors S_P1, S_P2, and S_P3 cut off a chip operation voltage that is applied to the respective voltage dividers 822, 824, and 826 according to a state of the detection stop signal GSTOP. The two cutoff PMOS transistors S_P4 and S_P5 cut off an operation voltage that is applied to the respective voltage comparators 842 and 844. The pull-up PMOS transistor PU_P1 pulls an input signal (a voltage at a node S4), inputted to the first buffering means 862, up to an operation voltage. The pull-down NMOS transistor PD_N1 pulls a signal (a voltage at a node S5), inputted to the second buffering means 864, down to a ground voltage. A gate electrode of the pull-up PMOS transistor PU_P1 is coupled to the signal supply first inverter S_INV1 for receiving an inverted signal $\overline{GSTOP}$ of the detection stop signal GSTOP. Each gate electrode of the pull-down NMOS transistor PD_N1, the three cutoff PMOS transistors S_P1, S_P2, and S_P3, and the two cutoff PMOS transistors S_P4 and S_P5 is coupled to the signal supply second inverter S_INV2.

The signal supply first inverter S_INV1 has a PMOS transistor GS_P1 and an NMOS transistor GS_N1. The signal supply second inverter S_INV2 has a PMOS transistor GS_P2 and an NMOS transistor GS_N2. A gate electrode of the PMOS transistor GS_P1 and a gate electrode of the NMOS transistor GS_N1 are interconnected to receive the detection stop signal GSTOP. A drain electrode of the PMOS transistor GS_P1 and a drain electrode of the NMOS transistor GS_N1 are interconnected to constitute an output terminal of the signal supply first inverter S_INV1. A source electrode of the NMOS transistor GS_N1 is coupled to a ground electrode. A gate electrode of the PMOS transistor GS_P2 and a gate electrode of the NMOS transistor GS_N2 are interconnected to be coupled to an output terminal of the signal supply first inverter S_INV1. A source electrode of the PMOS transistor GS_P2 receives the chip operation voltage. A drain electrode of the PMOS transistor GS_P2 and a drain electrode of the NMOS transistor GS_N2 are interconnected to constitute an output terminal of the signal supply second inverter 930. A source electrode of the NMOS transistor GS_N2 is coupled to a ground electrode.

The source electrodes of the three cutoff PMOS transistors S_P1, S_P2, and S_P3 are connected to a detector input terminal $D_{IN}$ for receiving the chip operation voltage. The gate electrodes of the three cutoff PMOS transistors S_P1, S_P2, and S_P3 are connected to an output terminal of the signal supply second inverter S_INV2 to receive the detection stop signal GSTOP. The drain electrodes of the three cutoff PMOS transistors S_P1, S_P2, and S_P3 are coupled to resistors R12, R22, and R32, respectively. Here the resistors R12, R22, and R32 are coupled to nodes S1, S2, and S3, respectively. Source electrodes of the two cutoff PMOS transistors S_P4 and S_P5 are coupled to the detector input terminal $D_{IN}$ receiving the chip operation voltage. Gate electrodes of the two cutoff PMOS transistors S_P4 and S_P5 are coupled to the output terminal of the signal supply second inverter S_INV2 to receive a detection stop signal GSTOP. Drain electrodes of the two cutoff PMOS transistors S_P4 and S_P5 are coupled to the voltage comparators 842 and 844, respectively. A gate electrode of the pull-up PMOS transistor PU_P1 is connected to the output terminal of the signal supply first inverter S_INV1 to receive the inverted signal GSTOP of the detection stop signal GSTOP. A source electrode of the pull-up PMOS transistor PU_P1 is coupled to the detector input terminal $D_{IN}$ for receiving the chip operation voltage. A drain electrode of the pull-up PMOS transistor PU_P1 is connected to a node S4 coupled to the output terminal $S_{OUT1}$ of the first voltage comparator 842. A gate electrode of the pull-down NMOS transistor PD_N1 is connected to the output terminal of the signal supply second inverter 930 S_INV2 to receive the detection stop signal GSTOP. A source electrode of the pull-down NMOS transistor PD_N1 is connected to the ground. A drain electrode of the pull-down NMOS transistor PD_N1 is connected to the node S5 coupled to the output terminal $S_{OUT2}$ of the second voltage comparator 844.

The delay first inverter 950 has first to fourth PMOS transistors D_P1, D_P2, D_P3, and D_P4 and one NMOS transistor D_N1. Each gate electrode of the PMOS transistors D_P1, D_P2, D_P3, and D_P4 is coupled to the detection stop signal 1200. A source electrode of the NMOS transistor D_N1 is coupled to a ground electrode. The PMOS transistors D_P1, D_P2, D_P3, and D_P4 are coupled in series to the chip operation voltage $V_{DD}$. A source electrode of the first PMOS transistor is coupled to the chip operation voltage $V_{DD}$ and a drain electrode of the fourth PMOS transistor D_P4 is coupled to a drain electrode of the NMOS transistor D_N1, making an output terminal of the delay first inverter D_INV1. A delay capacitor Cd is disposed between the output terminal of the delay first inverter D_INV1 and the ground electrode. The delay second inverter D_INV2 has a PMOS transistor D_P5 and an NMOS transistor D_N2. A gate electrode of the PMOS transistor D_P5 and a gate electrode of the NMOS transistor D_N1 are interconnected to be coupled to the output terminal of the delay first inverter D_INV1. A drain electrode of the PMOS transistor D_P5 and a drain electrode of the NMOS transistor D_N1 are interconnected to constitute an output terminal $D_{GSTOP}$ coupled to one input terminal of the OR gate 890. A source electrode of the PMOS transistor D_P5 is coupled to the chip operation voltage, and a source electrode of the NMOS transistor D_N2 is coupled to the ground electrode.

The operation of the glitch detection circuit with the glitch detection stop means shown in FIG. 8 is briefly described below.

When it is necessary to stop detecting a glitch for a while, a logic high detection stop signal (GSTOP) 1200 is generated from the detection stop signal source. Thus, a voltage of the node S4 between the first voltage comparator 842 and the first buffering means 862 is kept high (the operation voltage $V_{DD}$) and a voltage of the node S5 between the second voltage comparator 844 and the second buffering means 864 is kept low (the ground voltage; 0V). As a result, logic high signals are generated through each buffering means and inputted to the AND operation means 870 to generate a logic high detection signal at the detector output terminal $D_{OUT}$. The logic high detection signal is inputted to the other end of the OR gate 890, so that a logic high signal is generated at the output terminal $D_{OUT\_F}$ of the OR gate 890 to stop detecting a glitch.

However, if a logic low detection stop signal GSTOP is received from the detection stop signal source, the PMOS transistors D_P1, D_P2, D_P3, and D_P4 of the delay first inverter D_INV1 are all turned on and the NMOS transistor D_N1 thereof is turned off. Thus, an output of the delay first inverter D_INV1 becomes high and a logic low signal is generated at the output terminal $D_{GSTOP}$ of the delay second inverter D_INV2 to be inputted to one end of the OR gate 890. The PMOS transistors of the voltage dividers 822, 824, and 826 and the voltage comparators 824 and 844 are turned on, and the pull-up PMOS transistor PU_P1 and the pull-down NMOS transistor PD_N1 are turned off. Therefore, the glitch detection circuit shown in FIG. 8 operates the same as the glitch detection circuit shown in FIG. 5. Thus, a state of an output of each voltage comparator is varied according to the occurrence of a glitch, so that the glitch detection circuit normally operates. The AND to operation of output terminal signals of these glitch detection circuits is performed at the AND gate. Thereafter, the output terminal signals are coupled to the OR gate 890. Since a logic high signal is generated at the delay second inverter output terminal $D_{GSTOP}$, an output of the OR gate 890 is determined depending on an output of the AND gate 870.

The foregoing description of the preferred embodiments of the invention has been presented to illustrate the principles of the invention and not to limit the invention to the particular embodiment illustrated. It is intended that the scope of the invention is defined by the following claims and their equivalents.

What is claimed is:

1. A voltage-glitch detection circuit of an integrated circuit chip, comprising:
   a first voltage dividing circuit for dividing an operation voltage into a first voltage and a second voltage dividing circuit for dividing the operation voltage into a second voltage;
   a voltage comparator having a first input terminal and a second input terminal coupled to the first and second voltage, respectively and generating a first level comparison signal at an output terminal depending on a voltage difference between the first and second voltages; and
   a capacitor coupled to at least one of the two voltage dividing circuits and reversing a polarity of the voltage difference between the first voltage and second voltage when a glitch is generated at the operation voltage.

2. A voltage-glitch detection circuit of an integrated circuit chip, comprising:

a first voltage dividing circuit and a second voltage dividing circuit, each having at least two resistors coupled in series between an operation voltage for driving the integrated circuit chip and a ground;

a voltage comparator having a first input terminal coupled to a first node between the two resistors of the first voltage dividing circuit to receive a first node voltage and a second input terminal coupled to a second node between the two resistors of the second voltage dividing circuit to receive a second node voltage, the voltage comparator for generating a first comparison signal at an output terminal depending on a voltage difference between the first and second input terminals;

a buffer for buffering the first comparison signal to output a first detection signal; and a capacitor connecting one of the first and second nodes to ground, wherein the second voltage dividing circuit has a capacitor connected to the second node and the buffer includes two successive inverters;

wherein the first comparison signal is a logic high signal when the second node voltage is higher than the first node voltage; and wherein if a glitch occurs to temporarily increase the chip operation voltage, the first comparison signal of the comparator transitions from a logic high signal to a logic low signal and a logic high detection signal is generated by the buffer to detect the glitch.

3. A voltage-glitch detection circuit of an integrated circuit chip, comprising:

a first voltage dividing circuit and a second voltage dividing circuit, each having at least two resistors coupled in series between an operation voltage for driving the integrated circuit chip and a ground;

a voltage comparator having a first input terminal coupled to a first node between the two resistors of the first voltage dividing circuit to receive a first node voltage and a second input terminal coupled to a second node between the two resistors of the second voltage dividing circuit to receive a second node voltage, the voltage comparator for generating a first comparison signal at an output terminal depending on a voltage difference between the first and second input terminals;

a buffer for buffering the first comparison signal to output a first detection signal; and a capacitor connecting one of the first and second nodes to ground.

wherein the second voltage dividing circuit includes a capacitor connected between ground and the second node;

wherein the first comparison signal is a logic low signal when the second node voltage is lower than the first node voltage; and wherein if a glitch occurs to temporarily decrease the chip operation voltage, the first comparison signal of the comparator transitions from a logic low signal to a logic high signal and a logic low detection signal is generated by the buffer to signal glitch detection.

4. A voltage-glitch detection circuit of an integrated circuit chip, comprising:

a first voltage dividing circuit and a second voltage dividing circuit, each having at least two resistors coupled in series between an operation voltage for driving the integrated circuit chip and a ground;

a voltage comparator having a first input terminal coupled to a first node between the two resistors of the first voltage dividing circuit to receive a first node voltage and a second input terminal coupled to a second node between the two resistors of the second voltage dividing circuit to receive a second node voltage, the voltage comparator for generating a first comparison signal at an output terminal depending on a voltage difference between the first and second input terminals;

a buffer for buffering the first comparison signal to output a first detection signal; and a capacitor connecting one of the first and second nodes to ground, further comprising:

a third voltage dividing circuit having at least two resistors coupled in series between the operation voltage source and ground;

a second comparator having a first input terminal coupled to a third node between the two resistors of the third voltage dividing circuit to receive a third node voltage and a second input terminal to receive the second node voltage, the second comparator for generating a second comparison signal at an output terminal depending on a voltage difference between the two input terminals of the second comparator;

a second buffer for buffering the second comparison signal to output a second detection signal, the second buffer having a value between the first node voltage and the third node voltage; and AND operation means for performing an AND operation of the two detection signal to be outputted, wherein the second voltage dividing circuit includes a second capacitor.

5. The voltage-glitch detection circuit as recited in claim 4, wherein the third node voltage is higher than the first node voltage, the first buffer has two inverters, and the second buffer has one inverter.

6. The voltage-glitch detection circuit as recited in claim 5, further comprising:

a first grounded capacitor disposed at the first node; and a third grounded capacitor disposed at the second node, wherein capacitance of the first and third grounded capacitors are lower than the capacitance of the second capacitor.

7. The voltage-glitch detection circuit as recited in claim 4, wherein the third node voltage is higher than the first node voltage, the first buffer has two inverters serially coupled to each other, and the second buffer has one inverter.

8. A voltage-glitch detection circuit of an integrated circuit chip, comprising:

first and second voltage dividing means for dividing a chip operation voltage for driving the integrated circuit chip into first and second voltages having a first voltage difference by using at least two resistors sequentially coupled in series between the chip operation voltage and a ground;

first voltage comparing means having a first input terminal coupled to a first node between the two resistors of the first voltage dividing means to receive a first node voltage, a second input terminal coupled to a second node between the two resistors of the second voltage dividing means to receive a second node voltage, and a first comparator output terminal to output a first comparison signal depending on the first voltage difference;

first buffering means for receiving the first comparison signal and outputting a first detection signal to a first buffer output terminal, the first detection signal being obtained by buffering the first comparison signal;

a first capacitor disposed between the first node and a ground; and a second capacitor disposed between the second node and the ground, wherein capacitance of the first capacitor is so different from that of the second capacitor that when a glitch occurs at the operation voltage to change the first node voltage and the second node voltage into a first glitch voltage and a second glitch voltage respectively, a second voltage difference between the two glitch voltages has an opposite sign to the first voltage difference.

9. The voltage-glitch detection circuit as claimed in claim 8, wherein capacitance of the second capacitor is higher than that of the first capacitor, the first buffering means has two inverters serially coupled to the first comparator output terminal, the first comparator output terminal outputs a logic high first comparison signal and the first buffer output terminal outputs a logic high first detection signal through the first buffering means, and;

wherein if a high glitch attack occurs to increase the chip operation voltage, the first voltage becomes higher than the second glitch voltage, so that the first comparator terminal outputs a logic low first comparison signal and the first buffer output terminal outputs a logic low first detection signal through the first buffering means to detect a high glitch attack.

10. The voltage-glitch detection circuit as recited in claim 8, wherein the second capacitor has a higher capacitance than the first capacitor, the first buffering means has one inverter coupled to the first comparator output terminal, the first comparator output terminal outputs a logic low first comparison signal and the first buffer output terminal outputs a logic high first detection signal through the first buffering means because the first voltage is higher than the second voltage; and wherein if a low glitch occurs to decrease the chip operation voltage, the first voltage becomes lower than the second voltage, so that the first comparator output terminal outputs a logic high first comparison signal and the first buffer output terminal outputs a logic low first detection signal through the first buffering means to detect the low glitch attack.

11. The voltage-glitch detection circuit as recited in claim 8, further comprising:

third voltage dividing means for dividing the operation voltage into a third voltage by using the two resistors serially coupled between the detector input terminal and the ground, the second voltage having a value between the first voltage and the third voltage, and the second and third voltages having a second voltage difference;

second voltage dividing means having a first input terminal coupled to a third node between the two resistors of the third voltage dividing means to receive a third node voltage, a second input terminal to receive the second voltage, and a second comparator output terminal to output a second comparison signal depending on the second voltage difference;

second buffering means for inputting the second comparison signal and outputting a second detection signal to a second buffer output terminal, the second detection signal being obtained by buffering the second comparison signal; and AND operation means for performing an AND operation of the first and second detection signals to be outputted, wherein the third voltage dividing means includes a third capacitor disposed between the third node and the ground, capacitance of the third capacitor being substantially equal to that of the first capacitor.

12. The voltage-glitch detection circuit as recited in claim 11, wherein the first voltage is supplied as a detection voltage of the first voltage comparing means, the third voltage is supplied as a detection voltage of the second comparing means, the second voltage is supplied as a reference voltage of the first and second voltage comparing means, the third voltage is higher than the first voltage, the first buffering means has two inverters sequentially coupled in series to the first comparator output terminal, and the second buffering means has one inverter coupled to the first comparator output terminal.

13. The voltage-glitch detection circuit as recited in claim 12, wherein capacitance of the second capacitor is higher than capacitances of the first and third capacitors.

14. The voltage-glitch detection circuit as recited in claim 12, wherein capacitance of the second capacitor is lower than capacitances of the first and third capacitors.

15. A smart card embedding a semiconductor integrated circuit chip having a central processing unit (CPU) to detect both a low glitch and a high glitch, the smart card comprising:

a detector input terminal receiving an operation voltage for driving the integrated circuit chip;

first, second, and third voltage dividers for dividing first, second, and third voltages by using the operation voltage supplied to the detector input terminal and two resistors serially coupled to the detector input terminal and a ground respectively, the first voltage being lower than the second voltage and the second voltage being lower than the third voltage;

a first voltage comparator having a first comparator first input terminal coupled to a first node between the two resistors of the first voltage divider to receive a first node voltage, a first comparator second input terminal coupled to a second node between the two resistors of the second voltage divider to receive a second node voltage, and a first comparator output terminal to output a logic high comparison signal depending on a first voltage difference that is a difference between the second and first voltages;

a second voltage comparator having a second comparator first input terminal coupled to a third node of the two resistors of the third voltage divider to receive the third voltage of the third node, a second comparator second input terminal coupled to the second node to receive the second node voltage, and a second comparator output terminal to output a logic low comparison signal depending on a second voltage difference that is a difference between the second and third voltages;

first buffering means for buffering the logic high comparison signal of the first comparator output terminal to output a logic high first buffering signal to a first buffer output terminal;

second buffering means for buffering the logic low comparison signal of the second comparator output terminal to output a logic high second buffering signal to a second buffer output terminal;

AND operation means for performing an AND operation of the first and second buffering signals of the first and second buffer output terminals to output a logic high detection signal;

a detector output terminal receiving the logic high detection signal of the AND operation means; and a first capacitor disposed between the first node and a ground, a second capacitor disposed between the second node and a ground, and a third capacitor disposed between the third node and the ground, wherein capacitances of the first and third capacitors are substantially equal to each other but different from capacitance of the second capacitor.

16. The smart card as recited in claim 15, wherein the first buffering means has two inverters successively coupled in series to the first comparator output terminal and the second buffering means has one inverter couple to the second comparator output terminal; and wherein the capacitance of the second capacitor is higher than the capacitance of the first and third capacitors.

17. The smart card as recited in claim 15, wherein the first buffering means has two inverters successively coupled in series to the first comparator output terminal and the second buffering means has one inverter couple to the second comparator output terminal; and wherein the capacitance of the second capacitor is lower than the capacitance of the first and third capacitors.

18. A method for securing an integrated circuit device from an external glitch attack, comprising:

generating a reference voltage and a detection voltage by using an operation voltage for driving the integrated circuit device, the reference voltage being impervious to a glitch variation as compared to the detection voltage;

comparing the reference voltage with the detection voltage to detect a glitch attack occurring at the operation voltage of the integrated circuit device; and resetting the integrated circuit device when the glitch attack is detected.

* * * * *